US 7,945,231 B2

(12) United States Patent
Hoegerl et al.

(10) Patent No.: US 7,945,231 B2
(45) Date of Patent: May 17, 2011

(54) SEMICONDUCTOR DEVICE FOR AN ULTRA WIDEBAND STANDARD FOR ULTRA-HIGH-FREQUENCY COMMUNICATION, AND METHOD FOR PRODUCING THE SAME

(75) Inventors: Juergen Hoegerl, Regensburg (DE); Thomas Killer, Hohenschambach (DE)

(73) Assignee: Infineon Technologies AG, Neubiberg (DE)

( * ) Notice: Subject to any disclaimer, the term of this patent is extended or adjusted under 35 U.S.C. 154(b) by 896 days.

(21) Appl. No.: 11/675,342

(22) Filed: Feb. 15, 2007

(65) Prior Publication Data

US 2007/0200748 A1  Aug. 30, 2007

(30) Foreign Application Priority Data

Feb. 15, 2006  (DE) .......................... 10 2006 007 381

(51) Int. Cl.
  *H04M 1/03* (2006.01)
  *H01L 23/06* (2006.01)
(52) U.S. Cl. .......... 455/333; 455/83; 455/300; 257/700; 257/787
(58) Field of Classification Search .................... 455/73, 455/90.1, 333, 334, 341, 130, 300, 323, 344, 455/83, 550.1, 575.1, 575.7, 575.8; 343/700 MS, 343/702, 872; 257/499, 508, 659, 678, 687, 257/692, 693, 700, 704, 787, 780
See application file for complete search history.

(56) References Cited

U.S. PATENT DOCUMENTS

| 6,686,649 | B1 | 2/2004 | Mathews et al. |
| 6,770,955 | B1 * | 8/2004 | Coccioli et al. ............... 257/659 |
| 6,850,196 | B2 * | 2/2005 | Wong et al. .................... 343/702 |
| 7,049,682 | B1 * | 5/2006 | Mathews et al. .............. 257/660 |
| 7,183,985 | B2 * | 2/2007 | Tseng ............................ 343/702 |
| 7,245,884 | B2 * | 7/2007 | Oida et al. .................... 455/90.3 |
| 7,569,925 | B2 * | 8/2009 | Nishizawa et al. ........... 257/700 |
| 2004/0252064 | A1 * | 12/2004 | Yuanzhu ....................... 343/702 |
| 2005/0090300 | A1 * | 4/2005 | Zhang et al. ............... 455/575.7 |

FOREIGN PATENT DOCUMENTS

| GB | 2365629 A | 2/2002 |
| JP | 2003309483 | 10/2003 |
| WO | 01/95679 A1 | 12/2001 |
| WO | WO 01/95679 A1 * | 12/2001 |
| WO | 02/096166 A1 | 11/2002 |

* cited by examiner

*Primary Examiner* — Blane J Jackson
(74) *Attorney, Agent, or Firm* — Edell, Shapiro & Finnan, LLC (57) ABSTRACT

A semiconductor device for an ultra-wideband standard for ultra-high-frequency communication includes an ultra-wideband semiconductor chip and a multilayer circuit substrate with at least one lower metal layer and one upper metal layer, in which an ultra-wideband circuit with passive devices is arranged. The lower metal layer has external contact pads on which external contacts are arranged, via which the semiconductor device can be surface-mounted on a circuit board. In addition, the semiconductor device has an antenna which is operatively coupled to the ultra-wideband semiconductor chip via the circuit on the circuit substrate and is arranged above the semiconductor chip and the circuit substrate.

35 Claims, 7 Drawing Sheets

SEMICONDUCTOR DEVICE FOR AN ULTRA WIDEBAND STANDARD FOR ULTRA-HIGH-FREQUENCY COMMUNICATION, AND METHOD FOR PRODUCING THE SAME

CROSS REFERENCE TO RELATED APPLICATIONS

This application claims priority under 35 U.S.C. §119 to Application No. DE 102006007381.9 filed on Feb. 15, 2006, entitled "Semiconductor Device for an Ultra-Wideband Standard for Ultra-High-Frequency Communication, and Method for its Production," the entire contents of which are hereby incorporated by reference.

BACKGROUND

Semiconductor devices for an ultra-wideband standard for ultra-high-frequency communication are known to have a module for radio-frequency communication for the so-called "Bluetooth" concept and/or for the wireless LAN (local area network) concept. A module such as this has a transmitting and receiving circuit and an antenna. In this case, the known module has a mount substrate in the form of a laminated printed circuit board (PCB), which has a number of electrically conductive metal layers (M1-M5) and so-called micro-plated holes. The upper face of the board has an integrated antenna, which is formed by the upper metal layer (M5) and is electrically connected to the rest of the module. An ultra-wideband semiconductor chip is mounted on the other, opposite face of the printed circuit board.

Passive devices, such as filters, balancing elements ("baluns"), inductances and capacitors are arranged within the board and are connected to one another through various micro-plated holes. For this purpose, the module has external contacts in the form of ball grid arrays (BGA), which are arranged on the same side of the board as the semiconductor chip. A module such as this has the disadvantage that, on the one hand, it occupies a large amount of space in a corresponding ultra-high-frequency communication appliance, which space is normally not available, and on the other hand this module has the disadvantage that the formation and structuring of a fifth, upper metal layer to form an antenna structure for each of these ultra-wideband modules is costly and time-consuming.

Ultra-wideband semiconductor devices which can be used for the "Bluetooth" concept are intended to operate at a frequency of 2.4 GHz, while ultra-wideband semiconductor devices for the wireless LAN concept can be used both at 2.4 GHz and 5.7 GHz. Furthermore, there is a need for ultra-wideband semiconductor devices which are intended to operate in a frequency range f between 8 GHz$\leq$f$\leq$12 GHz. Multilayer circuit substrates composed of metal layers insulated by ceramic layers have been developed by preference for ultra-high-frequencies such as these, while there is a need to manage with multilayer circuit substrates for the ultra-wideband semiconductor devices for the "Bluetooth" applications and wireless LAN applications.

SUMMARY

The invention relates to a semiconductor device for an ultra-wideband standard for ultra-high-frequency communication, and to a method for its production. The semiconductor device has an ultra-wideband semiconductor chip and a multilayer circuit substrate with at least one lower metal layer and one upper metal layer, in which an ultra-wideband circuit with passive devices is arranged. The lower metal layer has external contact pads on which external contacts are arranged, via which the semiconductor device can be surface-mounted on a circuit board. In addition, the semiconductor device has an antenna which is operatively coupled to the ultra-wideband semiconductor chip via the circuit on the circuit substrate.

The ultra-wideband semiconductor device described herein can be produced at low cost and is intended to be available in a space-saving manner for ultra-wideband communication appliances.

The above and still further features and advantages of the described methods and devices will become apparent upon consideration of the following definitions, descriptions and descriptive figures of specific embodiments thereof, wherein like reference numerals in the various figures are utilized to designate like components. While these descriptions go into specific details of the methods and devices, it should be understood that variations may and do exist and would be apparent to those skilled in the art based on the descriptions herein.

BRIEF DESCRIPTION OF THE DRAWINGS

The invention will now be explained in more detail with reference to the attached figures, in which.

DETAILED DESCRIPTION

According to a first aspect of the invention, an ultra-wideband semiconductor device is provided for an ultra-wideband standard for ultra-high-frequency communication, and a method is provided for its production. The semiconductor device has an ultra-wideband semiconductor chip and a multilayer circuit substrate with at least one lower metal layer and one upper metal layer. An ultra-wideband circuit with passive devices is arranged in the circuit substrate. The lower metal layer has external contact pads on which external contacts are arranged, via which the semiconductor device can be surface-mounted on a circuit board. Furthermore, the semiconductor device has an antenna which is operatively coupled to the ultra-wideband semiconductor chip via the circuit on the circuit substrate. The antenna is arranged above the semiconductor chip and the circuit substrate, with the semiconductor device having a shield between the ultra-wideband circuit and the antenna.

This semiconductor device for an ultra-wideband standard has the advantage that the shielding improves the emission of electromagnetic waves which originate from the antenna. At the same time, the functionality of the ultra-wideband circuit, in particular of the passive devices in the circuit substrate, is not adversely affected by the radio-frequency electromagnetic radiation from the antenna, by virtue of the way in which the shield operates. Finally, the shield is also used to shield the ultra-wideband semiconductor chip with the ultra-wideband circuit on the circuit substrate against stray electromagnetic fields.

In one exemplary embodiment, the circuit substrate has an opening in which the ultra-wideband semiconductor chip is arranged, such that its rear face forms a coplanar surface with an upper face of the circuit substrate, and the antenna is arranged on the coplanar surface, while the active upper face of the semiconductor chip faces the lower face of the circuit substrate, and is operatively coupled via connecting elements to the circuit substrate and to the antenna.

This arrangement has the advantage that it occupies an extremely small amount of space, since the thickness of the ultra-wideband semiconductor device depends only on the thickness of the antenna and the thickness of the circuit substrate, because the semiconductor chip disappears completely in the opening of the circuit substrate and makes no contribution to the thickness of the semiconductor device. Furthermore, an embodiment such as this has the advantage that the metalized rear face of the semiconductor chip itself has a shield effect with respect to the antenna, and the active upper face of the semiconductor chip provides protection against reactions to the electromagnetic radiation from the antenna.

In a further exemplary embodiment, the connecting elements have bonding wires between the active upper face of the semiconductor chip and the lower metalization on the circuit substrate, with these bonding wires being arranged between contact pads on the active upper face of the semiconductor chip and contact connecting pads on the lower metal layer of the circuit substrate. This has the advantage of relatively low-cost assembly since, once the antenna has been fitted to the upper face of the circuit substrate and the semiconductor chip has been fixed in the opening that is provided, contact connecting pads on the lower metal layer can easily be associated with contact pads on the active upper face of the semiconductor chip. Furthermore, this allows the bonding wires or bonding wire connections to be considerably shorter than has been possible with the prior art until now.

In addition, the connecting elements in one exemplary embodiment of the first aspect of the invention are embedded in an encapsulation compound on the lower face of the circuit substrate, leaving the external contact pads free. This embedding process can be carried out both by a dispensing technique and by a molding technique, in which case the amount of encapsulation compound that is required is extremely small, because only the gap between the opening in the circuit substrate and the semiconductor chip, as well as the connecting elements, need be covered by the encapsulation compound.

In a further exemplary embodiment, the antenna is electrically connected via at least one through contact through the circuit substrate to the lower metal layer. A through contact such as this may be coaxial or in the form of a cavity resonator in order to achieve as great a shielding effect as possible for the ultra-wideband circuit on the circuit substrate.

In a further exemplary embodiment, the upper metal layer is structured as a shielding layer between the ultra-wideband circuit and the antenna. This has the advantage that the upper metal layer interacts with the metalized rear face of the semiconductor chip to effectively shield the ultra-wideband circuit on the circuit substrate as well as the active upper face of the ultra-wideband semiconductor chip from the antenna.

In the first aspect of the invention, as described above, the antenna forms the uppermost component of the ultra-wideband semiconductor device and is not protected against mechanical damage by an additional layer composed of an encapsulation compound. This concept of the external antenna is also retained for the next two further aspects of the invention. However, there is no opening in the circuit substrate to accommodate the semiconductor chip which, in fact, is arranged on the substrate. Finally, the antenna is provided as the upper component above the semiconductor chip.

In a second aspect of the invention, the rear face of the ultra-wideband semiconductor chip is arranged on the upper metal layer of the circuit substrate and is surrounded by a shield, with the antenna being arranged above the shield. For this purpose, the semiconductor chip and the shield are embedded in an encapsulation compound, and the antenna is arranged in a freely accessible manner on the upper face of the encapsulation compound. In order to electrically connect the antenna to the ultra-wideband circuit on the circuit substrate, this embodiment of the invention has at least one electrically conductive connecting pin through the encapsulation compound, which is electrically connected to a contact connecting pad on the upper metal layer on the circuit substrate.

This embodiment according to the second aspect of the invention has the advantage that a similar effect can be achieved by sheathing of the semiconductor chip with a metallic shield to that in the first aspect of the invention by the upper metal layer, in which the problem of shielding is additionally solved by the semiconductor chip being embedded "face-down" in an opening in the circuit substrate.

The fitting of the semiconductor chip to the circuit substrate according to the second aspect of the invention simplifies the assembly process, although the encapsulation compound must now be applied in two steps. In a first step, the semiconductor chip is embedded in a first encapsulation compound, on which a shielding layer composed of metal can be deposited as a shield. The remaining encapsulation compound is then applied to the circuit substrate, with the contact pin being introduced, in a second step.

This advantageously results in the formation of a planar upper face on the encapsulation compound, on which the antenna can in turn be arranged, while at the same being connected to the connecting pin. The active upper face of the semiconductor chip, which is arranged under the shield, has contact pads which are connected via bonding wires, still within the shield, to contact connecting pads on the circuit substrate. In this case, a minimum separation must be maintained between the active upper face of the semiconductor chip and the shield, in order to avoid shorts between the bonding wires.

In a third aspect of the invention, bonding wires are completely avoided by the active upper face of the ultra-wideband semiconductor chip facing the upper metal layer "face-down," and by the provision of flip-chip contacts as connecting elements for contact connecting pads on the upper metal layer on the circuit substrate. In this case as well, the semiconductor chip is surrounded by a shield, with the antenna being arranged above the shield. In this case, the shield can rest directly on the rear face of the semiconductor chip since there is no need for any additional separation for bonding wires. Both the semiconductor chip and the shield are embedded in an encapsulation compound, which forms an upper face on which the antenna is arranged. In this case, the encapsulation compound forms a planar upper face, on which the antenna is arranged, isolated from the shield, and is electrically connected via at least one electrically conductive connecting pin to a contact connecting pad on the upper metal layer on the circuit substrate.

In this embodiment of the invention with flip-chip contacts, there is advantageously no need for any separation between the shield and the semiconductor chip, and the shield can be directly electrically connected to the rear face contact of the semiconductor chip. This makes it possible to further reduce the thickness of the semiconductor device according to this third aspect of the invention in comparison to the second aspect of the invention with bonding wires.

In order to connect the shield to a ground potential, the shield is electrically connected to a contact connecting pad on the upper metal layer on the circuit substrate.

A fourth aspect of the invention provides for the rear face of the ultra-wideband semiconductor chip to be arranged on the upper metal layer of the circuit substrate, and to have a spacer, on which the antenna is fixed, on its active upper face. The spacer creates sufficient space to connect contact pads on the active upper face via bonding wires to the circuit substrate and to the contact connecting pads which are arranged on the circuit substrate. Furthermore, the spacer results in the antenna being arranged further away from the ultra-wideband circuit on the circuit substrate, so that reactions can be reduced. In this fourth aspect of the invention, both the semiconductor chip with the spacer and the antenna are completely embedded in an encapsulation compound on the upper face of the circuit substrate. This has the advantage that the surrounding plastic encapsulation compound protects the antenna against mechanical damage.

It is possible to avoid the effectiveness of the embedded antenna being adversely affected in comparison to a freely accessible antenna by suitable choice of a plastic or of a ceramic as the encapsulation compound in which the antenna is embedded. If the antenna is embedded in an encapsulation compound, there is no need to provide a contact pin, as required by the second and third aspects of the invention. Instead, it is possible to use the proven bonding technique, by a bonding wire being bonded from the antenna to a corresponding contact connecting pad on the upper metal layer. If the flat extent of the antenna overhangs the active upper face of the semiconductor chip, then the contact pads on the active upper face of the semiconductor chip can be electrically connected to the corresponding contact connecting pads on the circuit substrate via bonding wires, before the spacer is fitted to the antenna.

In a fifth aspect of the invention, the upper face of the ultra-wideband semiconductor chip faces the upper metal layer, "face-down," and flip-chip contacts are fixed as connecting elements to corresponding contact connecting pads on the upper metal layer. In this case, the antenna is fixed on the rear face of the semiconductor chip. The metallization on the rear face of the semiconductor chip in its own right provides restricted metallic shielding from the antenna. In this aspect of the invention, the antenna is preferably fixed on the rear face of the semiconductor chip by means of an insulating adhesive layer.

In this fifth aspect, provision is made for the semiconductor chip and the antenna on its rear face to be embedded in a common encapsulation compound on the upper face of the circuit substrate. An ultra-wideband semiconductor device such as this can be produced at relatively low cost, since fixing is carried out on the circuit substrate via flip-chip contacts of the semiconductor chips, and the antenna can be mounted on the metalized rear face of the semiconductor chip via an insulating adhesive. The components can be embedded in an encapsulation compound by dispensing or by filling with a ceramic paste, in which case, following dispensing, a curing process ensures that the encapsulation compound has adequate strength, and/or a sintering process allows the sintering paste to be sintered to an insulation ceramic.

A sixth and a seventh aspect of the invention likewise do not provide any opening in the circuit substrate, but position the ultra-wideband semiconductor chip either with its rear face on the upper metal layer of the circuit substrate or with its active front face via flip-chip contacts on the upper metal layer of the circuit substrate. In addition, in the case of the sixth and seventh embodiments of the invention, a corresponding shield is provided which encloses and surrounds the semiconductor chip, with the antenna being fixed directly on the shield, although in this case it is also mechanically secured by an insulating adhesive. Both the sixth and the seventh aspects of the invention provide for the semiconductor chip, the shield and the antenna to be embedded in a common encapsulation compound on the upper face of the circuit substrate. This is associated with the capability to once again electrically connect the antenna via a bonding wire in a simple manner to a contact connecting pad on the upper metal layer.

In all seven aspects of the invention, the circuit substrate preferably has at least one of the following passive devices, specifically capacitors and/or resistors and/or inductances and/or balancing elements ("baluns") and/or matching elements and/or filters. The provision of passive circuit elements in the multilayer circuit substrate is associated with the advantage that the semiconductor chip can be produced to be relatively compact and small. Provision is also made for the surface-mounted external contacts to have solder balls in a ball grid array (BGA). The solder ball technique is advantageous since it allows a multiplicity of surface-mounted external contacts to be arranged on the lower face of the semiconductor device.

One method for producing an ultra-wideband semiconductor device includes the following operations. First, an ultra-wideband semiconductor chip is produced, and a corresponding circuit substrate. The semiconductor chip is then electrically connected to the circuit substrate via connecting elements. The connecting elements, and at least part of the semiconductor chip as well, are then embedded in an encapsulation compound. An antenna is then fitted to these components above the semiconductor chip, and the antenna is connected to a contact connecting pad on the upper or lower metal layer of the circuit substrate via a connecting element.

This has the advantage that it can be performed at low cost and has only a small number of method steps. In this case, the way in which the individual method steps are carried out depends on the respective aspect of the semiconductor component according to the invention. This therefore results in seven slightly different method procedures for the seven aspects of the invention mentioned above.

In a first exemplary implementation of the method, in order to produce a circuit substrate, a plurality of plastic or ceramic layers are applied alternately with structured metal layers to one another, with through contacts and passive devices additionally being produced. In this case, for the first aspect of the invention, an opening can be provided in the circuit substrate in order to hold the semiconductor chip in the circuit substrate. If no such opening is provided, then a surface is provided during production of the circuit substrate in order to fix the rear face of the semiconductor chip on an upper metal layer. Furthermore, a plurality of contact connecting pads are prepared for connecting elements for the antenna and/or for contact pads on the upper face of the semiconductor chip.

This method variant can be used to produce a semiconductor device according to the second to fourth and sixth aspects of the invention. Finally, in order to produce the devices according to the invention for the third, fifth and seventh aspects of the invention, a circuit substrate having a plurality of contact connecting pads on an upper metal layer is provided, whose size and arrangement are matched to the size and arrangement of flip-chip contacts on a semiconductor chip. In general, flip-chip contacts and/or bonding wires are used as connecting elements between contact pads on the semiconductor chip and contact connecting pads on the circuit substrate. For connection of the antenna to the upper metal layer on the circuit substrate, provision is made to insert a connecting pin through an encapsulation contact, to form a through contact through the circuit substrate, and/or to use a bonding wire for the connection between the antenna and the upper metal layer. Different contact connecting pads are accordingly provided on the circuit substrate.

As previously mentioned, provision is also made for the semiconductor chip to be embedded in an encapsulation compound before the antenna is fitted above the semiconductor chip, and for this then to be sheathed by a shield which at least partially covers the wiring substrate. After the shield has been fitted, a further encapsulation compound with a connecting pin and/or a through contact to the circuit substrate can finally be applied to the circuit substrate, with the shield being sheathed or embedded, in order to prepare for the subsequent fitting of the antenna.

In summary, the new packaging structure allows the antenna and the ultra-wideband semiconductor chip to be integrated in one package. For this purpose the antenna can advantageously be placed directly on the substrate once the semiconductor chip has been arranged in an opening in the substrate, or the antenna can be integrated in an encapsulation compound or, finally, the antenna can be placed on an encapsulation compound.

Figure 1:
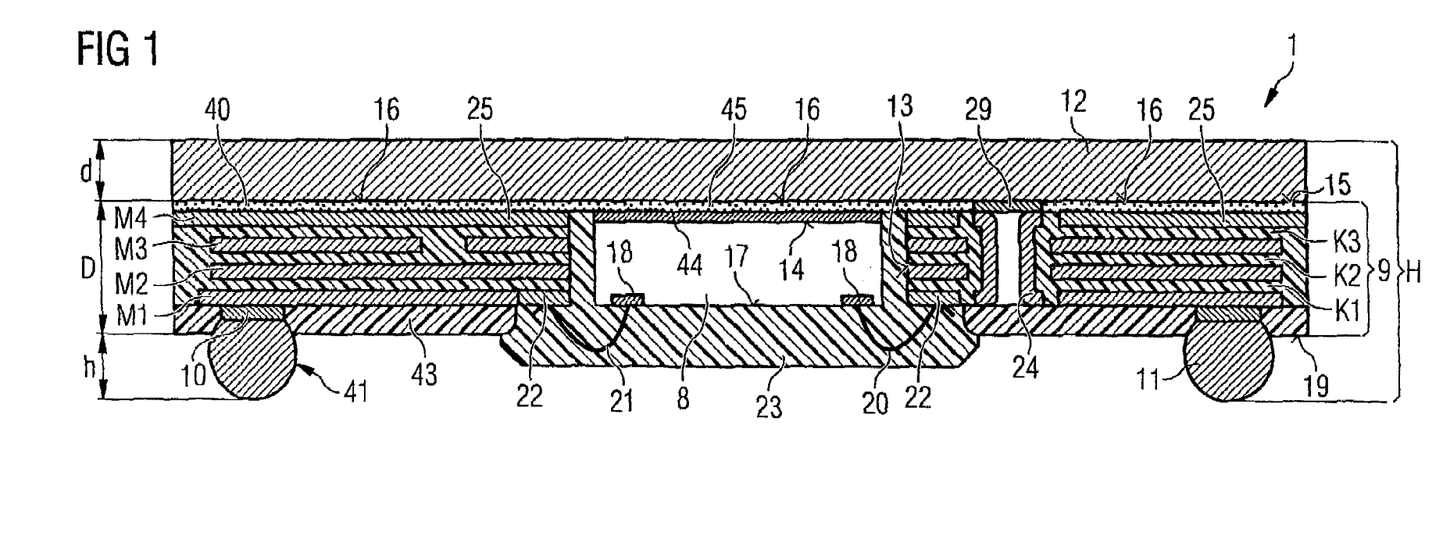
FIG. 1 shows a schematic cross section through an ultra-wideband semiconductor device according to a first embodiment of the invention.

Exemplary embodiments of the invention will now be described in conjunction with the figures. FIG. 1 shows a schematic cross section through an ultra-wideband semiconductor device 1 according to a first embodiment of the invention. This first embodiment of the invention essentially has a circuit substrate 9 with an ultra-wideband circuit composed of passive semiconductor devices, an ultra-wideband chip 8 and an antenna 12. For this purpose, the ultra-wideband chip 8 is arranged in a space saving manner in an opening 13 in the circuit substrate 9, such that the overall height H of the ultra-wideband semiconductor device 1 is governed by the thickness D of the circuit substrate 9, the thickness d of the antenna 12, and the height h of the external contacts 11. The circuit substrate 9 is a multilayer item and has three insulating plastic or ceramic layers K1, K2, and K3, which isolate four metal layers M1 to M4 from one another.

In this case, external contact pads 10 are arranged on the lower metal layer M1, are surrounded by a solder resist layer 43, and have external contacts 11 in the form of solder balls 41. While the middle metal layers M2 and M3 have conductor tracks and passive devices and connect them to one another, the upper metal layer M4 is in the form of a shielding layer 25 and protects the ultra-wideband circuit on the circuit substrate 9, which preferably has passive devices, such as capacitors and/or resistors and/or inductances and/or balancing elements ("baluns") and/or matching elements and/or filters, against feedback and reactions of the electromagnetic radiation from the antenna 12 which is fixed on the circuit substrate 9 via an insulating adhesive layer 40.

The ultra-wideband semiconductor chip 8 in FIG. 1 is a "face-down" version with its metalized rear face 14 being aligned in the opening 13 in such a manner that the metal layer 44 on the rear face 14 of the semiconductor chip 8 is mechanically connected via an adhesive layer 45 to the antenna 12. The active upper face 17 with contact pads 18 on the semiconductor chip 8 faces the lower face 19 of the circuit substrate 9, with the contact pads 18 being electrically connected via connecting elements 20 in the form of bonding wires 21 to corresponding contact connecting pads 22 on the lower metal layer M1. An encapsulation compound 23 is arranged in the space or gap between the opening 13 in the circuit substrate 9 and the semiconductor chip 8 that is positioned in the opening, and embeds the connecting elements 20 at the same time.

The antenna 12 is electrically connected via a contact connecting pad 29 and a through contact 24 to the lower metal layer M1, in which case the through contact 24 may be in the form of a waveguide and/or may be coaxial, in order to ensure shielded signal transmission between the semiconductor chip 8 and the antenna 12. The advantage of this ultra-wideband semiconductor device is that, on the one hand, it can be manufactured at low cost and, on the other hand, it has a minimal overall physical height H, since the semiconductor chip is accommodated in opening 13 of the circuit substrate 9, and a coplanar surface 16, on which the antenna 12 is arranged such that it is freely accessible, is formed on its rear face 14 and the upper face 15 of the circuit substrate 9.

Figure 2:
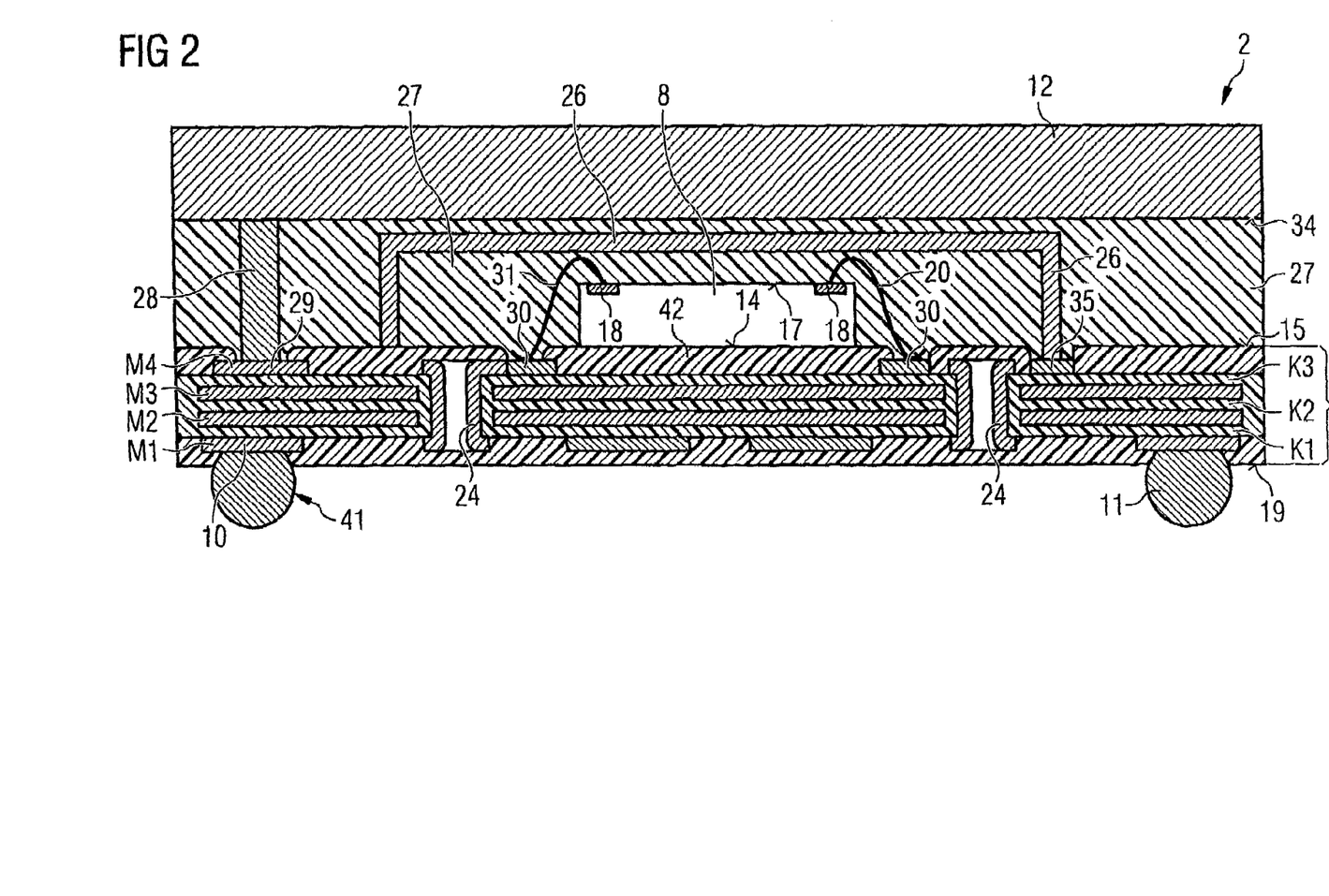
FIG. 2 shows a schematic cross section through an ultra-wideband semiconductor device according to a second embodiment of the invention.

FIG. 2 shows a schematic cross section through an ultra-wideband semiconductor device 2 according to a second embodiment of the invention. Components having the same functions as those in FIG. 1 are allocated with the same reference symbols, and will not be explained again. In this second embodiment of the invention, the antenna 12 is likewise arranged in a freely accessible manner, but there is a gap between the antenna 12 and the circuit substrate 9 which is bridged by a connecting pin 28, which is connected to a contact connecting pad 29 on the upper metal layer M4. This gap between the circuit substrate 9 and the antenna 12 is required in this second embodiment of the invention since there is no opening in the circuit substrate 9, as in the first embodiment, for holding the semiconductor chip 8. In fact, the semiconductor chip 8 is arranged "face-up" on the upper face 15 of the circuit substrate 9 on a surface 42 for fixing of the semiconductor chip 8.

The surface 42 may be provided on an insulating adhesive layer and/or on a metal layer on the upper metal layer M4 for the rear face of the ultra-wideband semiconductor chip 8. The upper face 17 of the ultra-wideband semiconductor chip 8 is electrically connected by its contact pads 18 via bonding wires 31 to corresponding contact connecting pads 30 on the upper metal layer M4, with through contacts 24 between the metal layers M1 to M4 ensuring that the various metal layers M1 to M4 can be electrically connected to one another and to the semiconductor chip.

Furthermore, a shield 26 is arranged in the space between the antenna 12 and the circuit substrate 9. Shield 26 surrounds the semiconductor chip 8 and is electrically connected via a contact connecting pad 35 to the upper metal layer M4. By way of example, a ground potential can be applied to the shield 28 via this contact connecting pad 35. An encapsulation compound 27 is arranged not only within the shield 26, in order to embed the semiconductor chip 8, but also outside the shield 26, in order to form an upper face 34 for holding the antenna 12. Within this encapsulation compound 27, the connecting pin 28 connects the antenna 12, outside the shield 26, to the contact connecting pad 29 on the upper metal layer M4.

Figure 3:
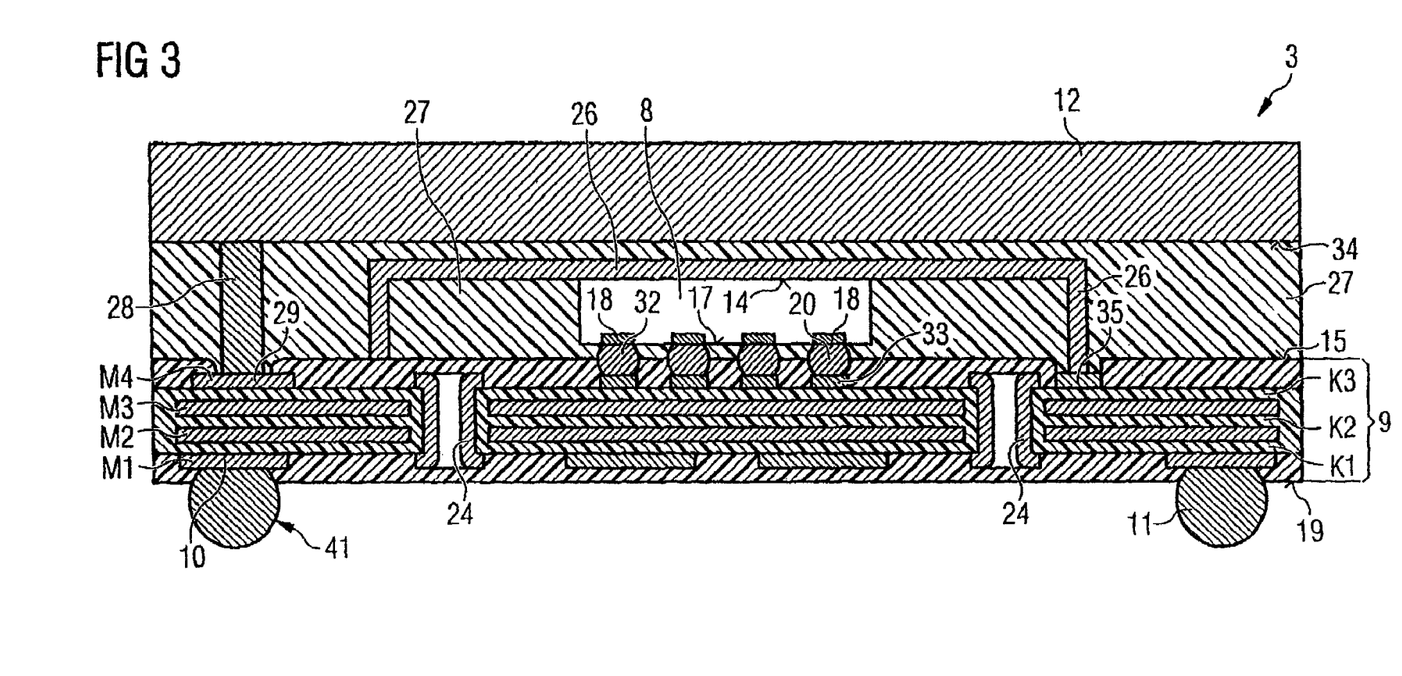
FIG. 3 shows a schematic cross section through an ultra-wideband semiconductor device according to a third embodiment of the invention.

FIG. 3 shows a schematic cross section through an ultra-wideband semiconductor device 3 according to a third embodiment of the invention. This third embodiment of the invention once again has an external antenna 12 which is arranged on the upper face 34 of an encapsulation compound 27, and differs from the second embodiment of the invention in that the semiconductor chip 8 is equipped, based on a "face-down" technique, with flip-chip contacts 32 as connecting elements for contact connecting pads 33 on the upper metal layer M4. In addition, this semiconductor device can be made more compact than the second embodiment, because the shield 26 can be fixed directly on the rear face 14 of the semiconductor chip 8. All the other features and components of the third embodiment of the invention correspond to those in the second embodiment of the invention as shown in FIG. 2, and will not be explained again, in order to avoid repetition.

Figure 4:
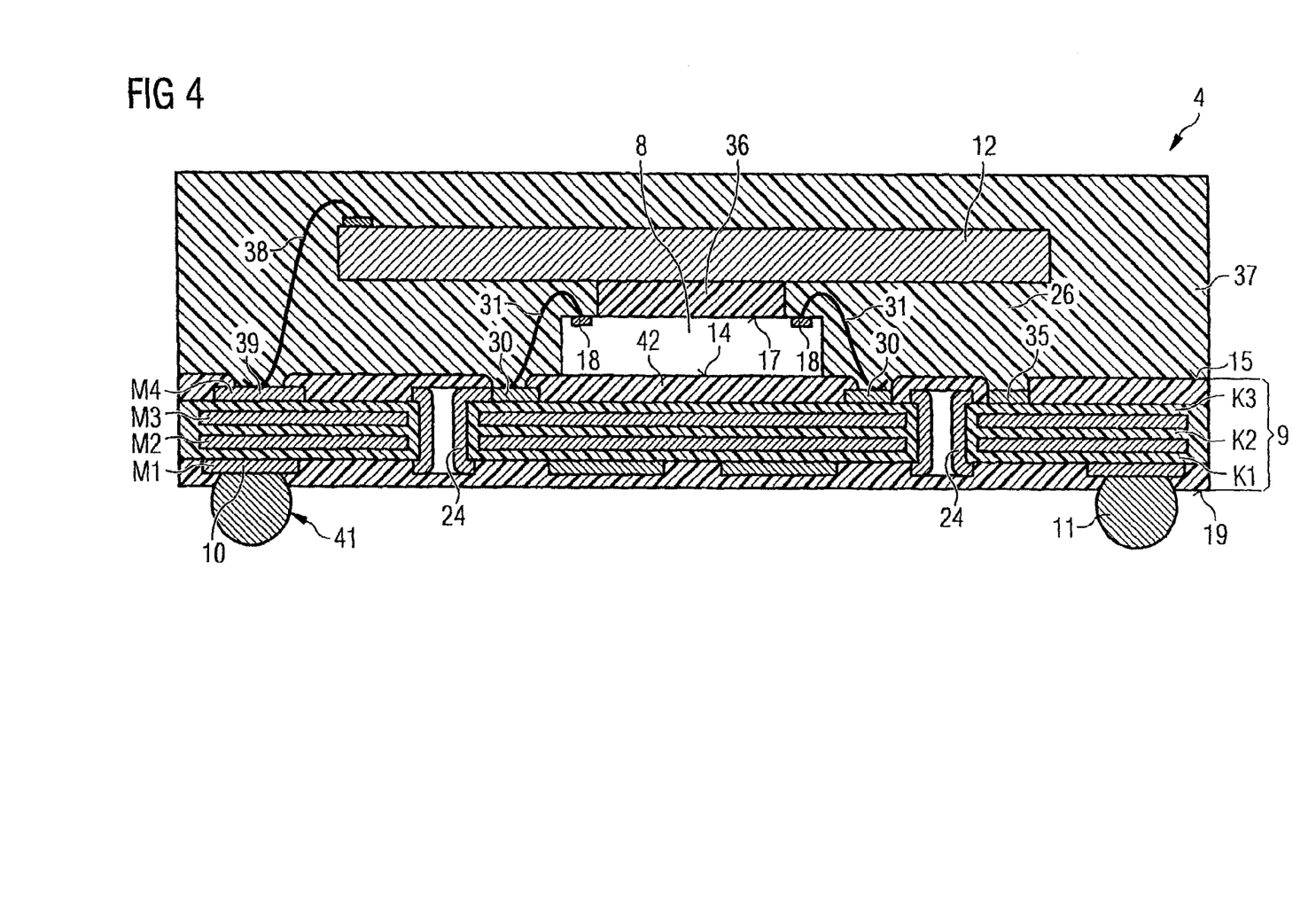
FIG. 4 shows a schematic cross section through an ultra-wideband semiconductor device according to a fourth embodiment of the invention.

FIGS. 4 to 7 show four further embodiments of the invention, which are characterized in that the antenna 12 is completely embedded in a plastic encapsulation compound 37. For this purpose, FIG. 4 shows an ultra-wideband semiconductor device 4 according to a fourth embodiment of the invention, in which the semiconductor chip 8 is fixed by its lower face 14, "face-up", on a surface 42 which is provided for this purpose on the upper face 15 of the circuit substrate 9. The upper face 17 is fitted with a spacer 36, on which the antenna 12 is fixed. The spacer 36 ensures that the contact pads 18 on the upper face 17 of the semiconductor chip 8 can be connected via bonding wires 31 to contact connecting pads 30 on the upper metal layer M4. The fact that the antenna 12 is completely embedded in the plastic encapsulation compound 37 makes it possible to electrically connect the antenna 12 to a corresponding contact connecting pad 39 on the upper metal layer M4 by means of a single bonding wire connection 38. This embodiment of the invention has the advantage that both the semiconductor chip 8 and the antenna 12 are connected to the circuit substrate 9 using relatively low-cost bonding technology.

Figure 5:
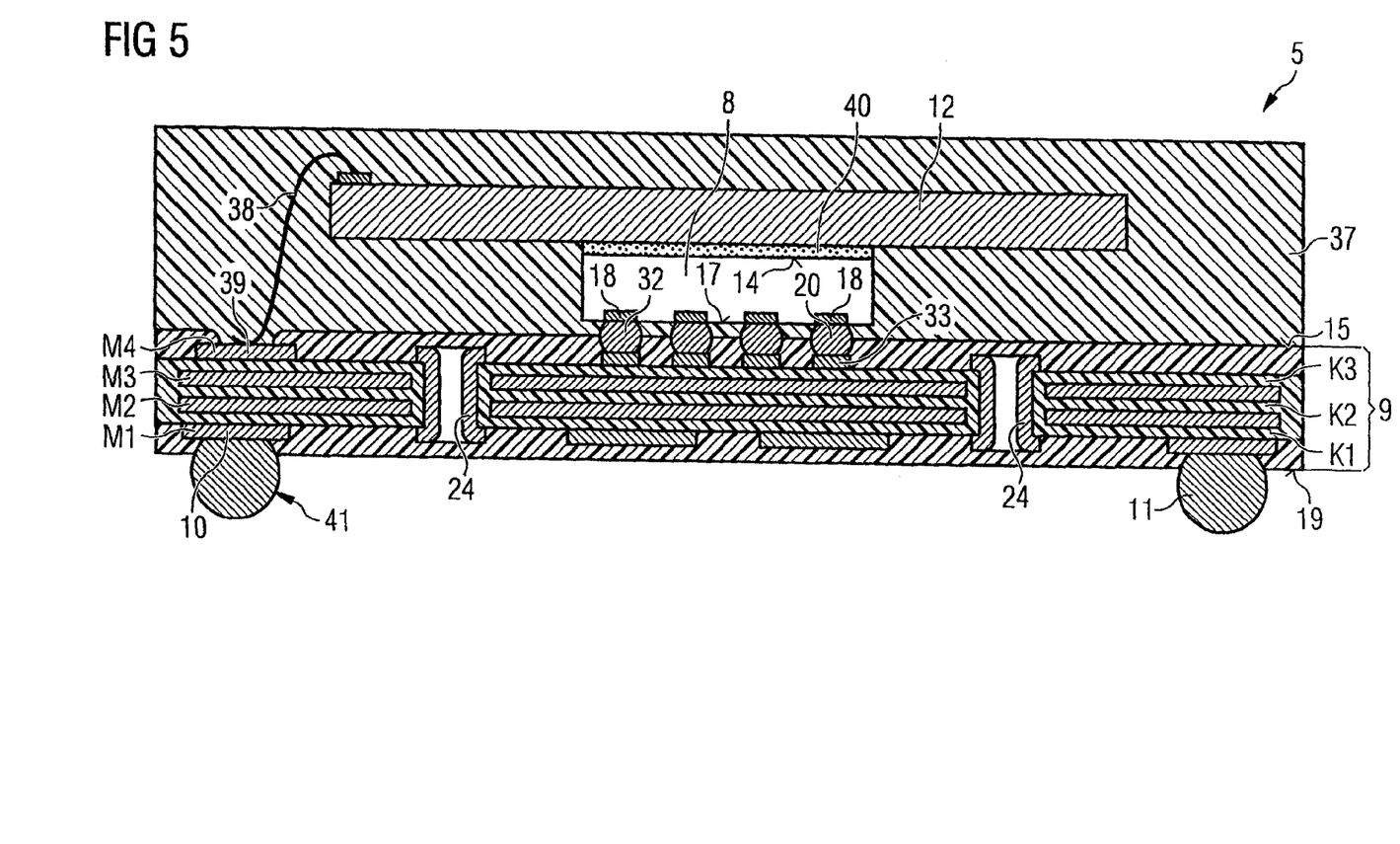
FIG. 5 shows a schematic cross section through an ultra-wideband semiconductor device according to a fifth embodiment of the invention.

FIG. 5 shows a schematic cross section through an ultra-wideband semiconductor device 5 according to a fifth embodiment of the invention, in which the semiconductor chip 8 is connected "face-down" via chip contacts 32 as connecting elements 20 for contact connecting pads 33 of the upper metal layer M4, while the antenna 12, which is completely embedded in plastic encapsulation compound 37, is likewise electrically connected to the upper metal layer M4 via a bonding wire 38 with a corresponding contact connecting pad 39. One advantage of this embodiment shown in FIG. 5 in comparison to the embodiment shown in FIG. 4 is that the antenna 12 can be mechanically fixed directly on the rear face 14 of the semiconductor chip 8 via an insulating adhesive layer 40.

Figure 6:
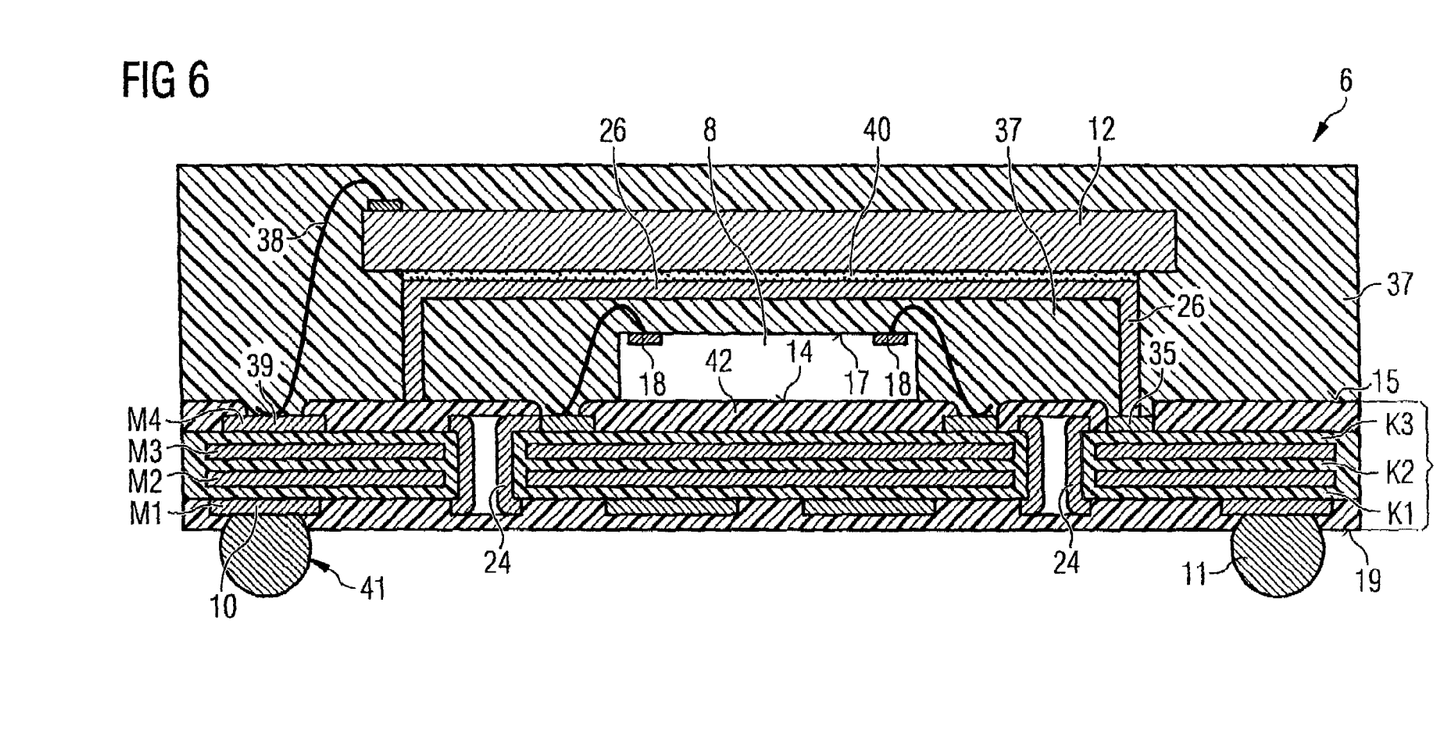
FIG. 6 shows a schematic cross section through an ultra-wideband semiconductor device according to a sixth embodiment of the invention.

FIG. 6 shows a schematic cross section through an ultra-wideband semiconductor device 6 according to a sixth embodiment of the invention, in which an additional shield 26 is arranged between the ultra-wideband semiconductor chip 8 and the antenna 12. For this purpose, the shield 26 is connected to the circuit substrate 9 via a contact connecting pad 35, and the ultra-wideband semiconductor chip is arranged "face-up" on one surface 42 of the semiconductor substrate 9. In this sixth embodiment of the invention, the electrical connections between the semiconductor chip 8 and the circuit substrate 9 as well as those between the antenna 12 and the circuit substrate 9 are once again provided by means of low-cost bonding connections.

Figure 7:
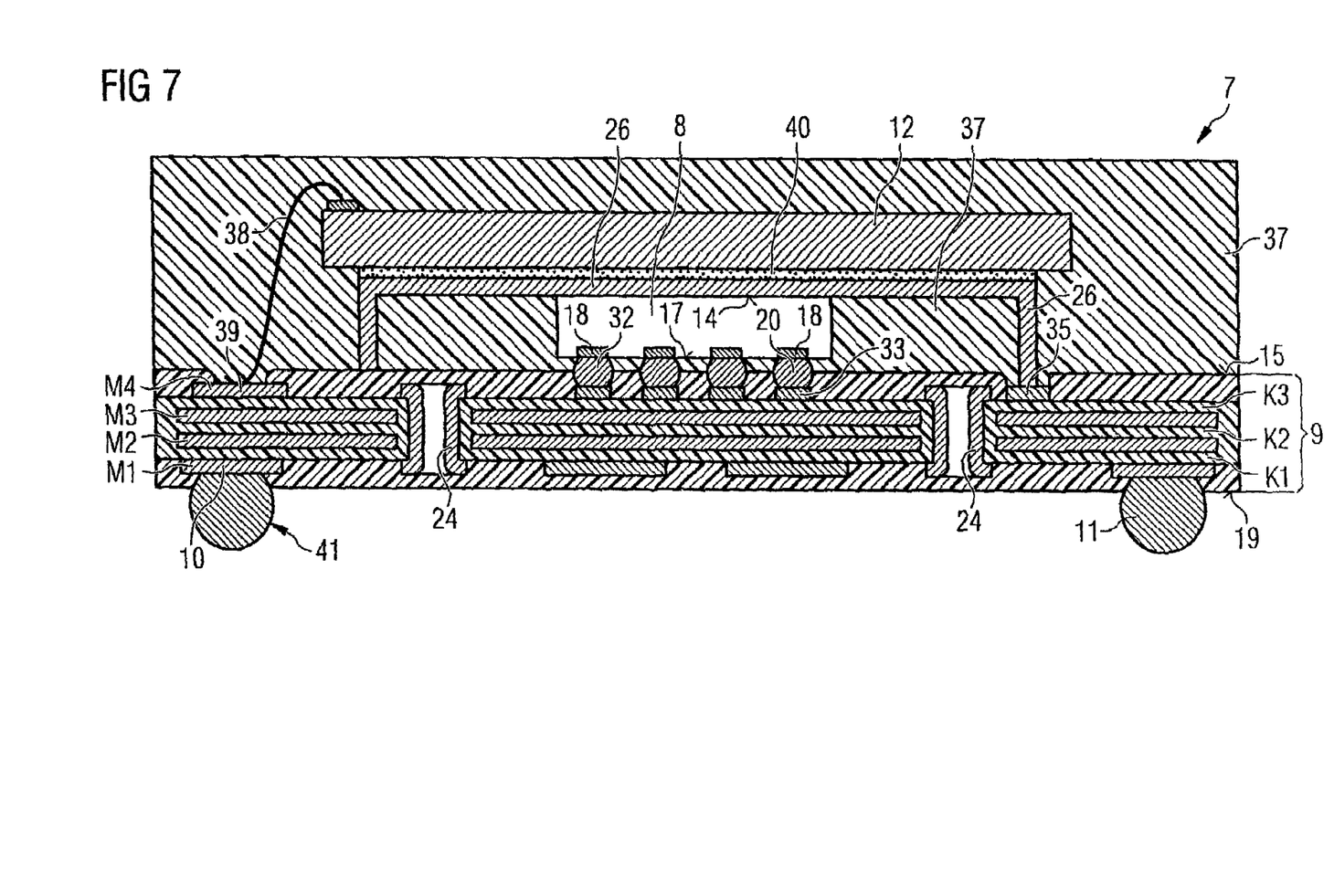
FIG. 7 shows a schematic cross section through an ultra-wideband semiconductor device according to a seventh embodiment of the invention.

FIG. 7 shows a schematic cross section through an ultra-wideband semiconductor device 7 according to a seventh embodiment of the invention, with the seventh embodiment of the invention corresponding to the sixth embodiment as shown in FIG. 6, with the difference that the semiconductor chip 8 is fixed on the circuit substrate 9 "face-down" via flip-chip contacts 32 as connecting elements 20 for contact connecting pads 33 on the upper metal layer M4.

The shield 26 can thus be fixed directly on the rear face 14 of the semiconductor chip 8, while the antenna 12 is arranged outside the shield above an insulating adhesive layer 40 on the shield 26. Since, in this case as well, the antenna 12 is completely embedded in a plastic encapsulation compound 37, it is on the one hand protected against damage while, on the other hand, the antenna 12 can be connected to a contact connecting pad 39 on the upper metal layer M4 by means of a single bonding connection 38.

While the methods and devices have been described in detail with reference to specific embodiments thereof, it will be apparent to one of ordinary skill in the art that various changes and modifications can be made therein without departing from the spirit and scope thereof. Accordingly, it is intended that the present methods and devices cover the modifications and variations of this method and device provided they come within the scope of the appended claims and their equivalents.

What is claimed is:

1. An ultra-wideband semiconductor device for an ultra-wideband standard for ultra-high-frequency communication, comprising:
   an ultra-wideband semiconductor chip;
   an ultra-wideband circuit with passive devices;
   a multilayer circuit substrate with at least a lower metal layer and an upper metal layer, in which the ultra-wideband circuit is arranged, and wherein the lower metal layer comprises external contact pads on which external contacts are arranged, enabling the semiconductor device to be surface-mounted on a circuit board, wherein the circuit substrate comprises an opening in which the semiconductor chip is arranged face-down such that a rear face of the semiconductor chip forms a coplanar surface with an upper face of the circuit substrate;
   an antenna operatively coupled to the semiconductor chip via the ultra-wideband circuit and arranged on the coplanar surface above the semiconductor chip and the circuit substrate, wherein an active upper face of the semiconductor chip faces a lower face of the circuit substrate and is operatively coupled via connecting elements to the circuit substrate and to the antenna; and
   a shield for the ultra-wideband circuit.

2. The ultra-wideband semiconductor device as claimed in claim 1, wherein the connecting elements comprise bonding wires arranged between contact pads on the active upper face of the semiconductor chip and contact connecting pads on the lower metal layer of the circuit substrate.

3. The ultra-wideband semiconductor device as claimed in claim 1, wherein the connecting elements are embedded in an encapsulation compound on the lower face of the circuit substrate, leaving the external contact pads free.

4. The ultra-wideband semiconductor device as claimed in claim 1, wherein the antenna is electrically connected via at least one through contact through the circuit substrate to the lower metal layer.

5. The ultra-wideband semiconductor device as claimed in claim 1, wherein the shield comprises the upper metal layer, which is structured as a shielding layer between the ultra-wideband circuit and the antenna.

6. The ultra-wideband semiconductor device as claimed in claim 1, wherein the metal layers of the circuit substrate comprise at least one of the following passive devices: capacitors, resistors, inductors, balancing elements (baluns), matching elements, and filters.

7. The ultra-wideband semiconductor device as claimed in claim 1, wherein the external contacts comprise solder balls arranged in a ball grid array (BGA).

8. An ultra-wideband semiconductor device for an ultra-wideband standard for ultra-high-frequency communication, comprising:
   an ultra-wideband semiconductor chip;
   an ultra-wideband circuit with passive devices;
   a multilayer circuit substrate with at least a lower metal layer and an upper metal layer, in which the ultra-wideband circuit is arranged, and wherein the lower metal layer comprises external contact pads on which external contacts are arranged, enabling the semiconductor device to be surface-mounted on a circuit board, wherein the semiconductor chip is arranged face-up, with a rear face of the semiconductor chip being arranged on the upper metal layer of the circuit substrate;
   an antenna operatively coupled to the semiconductor chip via the ultra-wideband circuit and arranged above the semiconductor chip and the circuit substrate; and
   a shield for the ultra-wideband circuit, wherein the semiconductor chip is surrounded by the shield and the antenna is arranged above the shield.

9. The ultra-wideband semiconductor device as claimed in claim 8, wherein:
   the semiconductor chip and the shield are embedded in an encapsulation compound; and
   the antenna is arranged on an upper face of the encapsulation compound and is electrically connected via at least one electrically conductive through contact pin to a contact connecting pad on the upper metal layer of the circuit substrate.

10. The ultra-wideband semiconductor device as claimed in claim 8, wherein an active upper face of the semiconductor chip comprises contact pads which are electrically connected via connecting elements to contact connecting pads on an upper face of the circuit substrate.

11. The ultra-wideband semiconductor device as claimed in claim 10, wherein the connecting elements comprise bonding wires.

12. An ultra-wideband semiconductor device for an ultra-wideband standard for ultra-high-frequency communication, comprising:
   an ultra-wideband semiconductor chip;
   an ultra-wideband circuit with passive devices;
   a multilayer circuit substrate with at least a lower metal layer and an upper metal layer, in which the ultra-wideband circuit is arranged, and wherein the lower metal layer comprises external contact pads on which external contacts are arranged, enabling the semiconductor device to be surface-mounted on a circuit board, wherein an active upper face of the semiconductor chip points face-down in the direction of the upper metal layer and comprises flip-chip contacts as connecting elements for contact connecting pads on the upper metal layer of the circuit substrate;
   an antenna operatively coupled to the semiconductor chip via the ultra-wideband circuit and arranged above the semiconductor chip and the circuit substrate; and
   a shield for the ultra-wideband circuit, wherein the semiconductor chip is surrounded by the shield and the antenna is arranged above the shield.

13. The ultra-wideband semiconductor device as claimed in claim 12, wherein:
   the semiconductor chip and the shield are embedded in an encapsulation compound; and
   the antenna is arranged on an upper face of the encapsulation compound, and is electrically connected via at least one electrically conductive through connecting pin to a contact connecting pad on the upper metal layer of the circuit substrate.

14. The ultra-wideband semiconductor device as claimed in claim 12, wherein the shield is electrically connected to a contact connecting pad on the upper metal layer, and is secured to a rear face of the semiconductor chip.

15. An ultra-wideband semiconductor device for an ultra-wideband standard for ultra-high-frequency communication, comprising:
   an ultra-wideband semiconductor chip;
   an ultra-wideband circuit with passive devices;
   a multilayer circuit substrate with at least a lower metal layer and an upper metal layer, in which the ultra-wideband circuit is arranged, and wherein the lower metal layer comprises external contact pads on which external contacts are arranged, enabling the semiconductor device to be surface-mounted on a circuit board, wherein the semiconductor chip is arranged face-up, with a rear face of the semiconductor chip being arranged on the upper metal layer of the circuit substrate;
   an antenna operatively coupled to the semiconductor chip via the ultra-wideband circuit and arranged above the semiconductor chip and the circuit substrate;
   a spacer arranged on an upper face of the semiconductor chip, the antenna being secured to the spacer; and
   a shield for the ultra-wideband circuit.

16. The ultra-wideband semiconductor device as claimed in claim 15, wherein the semiconductor chip, the spacer, and the antenna are embedded in an encapsulation compound on an upper face of the circuit substrate.

17. The ultra-wideband semiconductor device as claimed in claim 15, wherein the antenna is electrically connected via at least one bonding wire connection to a contact connecting pad on the upper metal layer.

18. The ultra-wideband semiconductor device as claimed in claim 15, wherein an active upper face of the semiconductor chip comprises contact pads which are electrically connected via bonding wires to contact connecting pads on the upper metal layer.

19. An ultra-wideband semiconductor device for an ultra-wideband standard for ultra-high-frequency communication, comprising:
   an ultra-wideband semiconductor chip;
   an ultra-wideband circuit with passive devices;
   a multilayer circuit substrate with at least a lower metal layer and an upper metal layer, in which the ultra-wideband circuit is arranged, and wherein the lower metal layer comprises external contact pads on which external contacts are arranged, enabling the semiconductor device to be surface-mounted on a circuit board, wherein an active upper face of the semiconductor chip faces the upper metal layer face-down and comprises flip-chip contacts as connecting elements that are secured to contact connecting pads on the upper metal layer;
   an antenna secured to a rear face of the semiconductor chip and operatively coupled to the semiconductor chip via the ultra-wideband circuit and arranged above the semiconductor chip and the circuit substrate; and
   a shield for the ultra-wideband circuit.

20. The ultra-wideband semiconductor device as claimed in claim 19, wherein the antenna is electrically connected via at least one bonding wire connection to a contact connecting pad on the upper metal layer.

21. The ultra-wideband semiconductor device as claimed in claim 19, wherein an insulating adhesive layer is arranged between the antenna and the rear face of the semiconductor chip.

22. The ultra-wideband semiconductor device as claimed in claim 19, wherein the semiconductor chip and the antenna are embedded in an encapsulation compound on an upper face of the circuit substrate.

23. An ultra-wideband semiconductor device for an ultra-wideband standard for ultra-high-frequency communication, comprising:
   an ultra-wideband semiconductor chip;
   an ultra-wideband circuit with passive devices;
   a multilayer circuit substrate with at least a lower metal layer and an upper metal layer, in which the ultra-wideband circuit is arranged, and wherein the lower metal layer comprises external contact pads on which external contacts are arranged, enabling the semiconductor device to be surface-mounted on a circuit board, wherein the semiconductor chip is arranged face-up, with a rear face of the semiconductor chip being arranged on the upper metal layer of the circuit substrate;
   an antenna operatively coupled to the semiconductor chip via the ultra-wideband circuit and arranged above the semiconductor chip and the circuit substrate; and
   a shield for the ultra-wideband circuit, wherein the semiconductor chip is surrounded by the shield and the antenna is secured to the shield.

24. An ultra-wideband semiconductor device for an ultra-wideband standard for ultra-high-frequency communication, comprising:
   an ultra-wideband semiconductor chip;
   an ultra-wideband circuit with passive devices;
   a multilayer circuit substrate with at least a lower metal layer and an upper metal layer, in which the ultra-wideband circuit is arranged, and wherein the lower metal layer comprises external contact pads on which external contacts are arranged, enabling the semiconductor device to be surface-mounted on a circuit board, wherein an active upper face of the semiconductor chip faces face-down in the direction of the upper metal layer and comprises flip-chip contacts as connecting elements for contact connecting pads on the upper metal layer of the circuit substrate;
   an antenna operatively coupled to the semiconductor chip via the ultra-wideband circuit and arranged above the semiconductor chip and the circuit substrate; and
   a shield for the ultra-wideband circuit, wherein the semiconductor chip is surrounded by the shield and the antenna is secured to the shield.

25. The ultra-wideband semiconductor device as claimed in claim 23, wherein an insulating adhesive layer is arranged between the antenna and the shield.

26. The ultra-wideband semiconductor device as claimed in claim 23, wherein the antenna is electrically connected via at least one bonding wire connection to a contact connecting pad on the upper metal layer.

27. The ultra-wideband semiconductor device as claimed in claim 23, wherein the semiconductor chip, the shield, and the antenna are embedded in an encapsulation compound on an upper face of the circuit substrate.

28. A method for producing an ultra-wideband semiconductor device, the method comprising:
   producing a circuit substrate with at least a lower metal layer and an upper metal layer;
   connecting an ultra-wideband semiconductor chip to the circuit substrate via connecting elements, wherein the circuit substrate is formed to include a plurality of contact connecting pads on the upper metal layer, whose size and arrangement are matched to the size and arrangement of flip-chip contacts on the semiconductor chip;
   embedding the connecting elements and at least part of the semiconductor chip in an encapsulation compound;
   fitting an antenna above the semiconductor chip; and
   connecting the antenna to a contact connecting pad on the upper or lower metal layer of the circuit substrate via a connecting element.

29. The method as claimed in claim 28, wherein the circuit substrate is formed with alternating plastic or ceramic layers and structured metal layers, the circuit substrate being formed to include through contacts and passive devices.

30. The method as claimed in claim 28, wherein the circuit substrate is formed with an opening for holding the semiconductor chip.

31. The method as claimed in claim 28, wherein the circuit substrate is formed to include a surface for securing a rear face of the semiconductor chip to the upper metal layer and to include a plurality of contact connecting pads for connecting the circuit substrate to at least one of the antenna and contact pads on an upper face of the semiconductor chip.

32. The method as claimed in claim 28, wherein flip-chip contacts or bonding wires are used as the connecting elements between contact pads on the semiconductor chip and contact connecting pads on the circuit substrate.

33. The method as claimed in claim 28, wherein, a connecting pin, a through contact, or a bonding wire is used as the connecting element between the antenna and a contact connecting pad on the upper metal layer of the circuit substrate.

34. The method as claimed in claim 28, wherein, after embedding the semiconductor chip in the encapsulation compound and prior to fitting the antenna above the semiconductor chip, the method further comprises sheathing the semiconductor chip with a shield which at least partially covers the circuit substrate.

35. A method for producing an ultra-wideband semiconductor device, the method comprising:
   producing a circuit substrate with at least a lower metal layer and an upper metal layer;
   connecting an ultra-wideband semiconductor chip to the circuit substrate via connecting elements;
   embedding the connecting elements and at least part of the semiconductor chip in an encapsulation compound;
   sheathing the semiconductor chip with a shield which at least partially covers the circuit substrate;
   applying a further encapsulation compound with a connecting pin or a through contact to the circuit substrate such that the shield is sheathed or embedded;
   fitting an antenna above the semiconductor chip; and
   connecting the antenna to a contact connecting pad on the upper or lower metal layer of the circuit substrate via a connecting element.

* * * * *